United States Patent [19]

Speranza

[11] Patent Number: 4,469,974

[45] Date of Patent: Sep. 4, 1984

[54] LOW POWER ACOUSTIC FUEL INJECTOR DRIVE CIRCUIT

[75] Inventor: Donald Speranza, Canton, Mich.

[73] Assignee: Eaton Corporation, Cleveland, Ohio

[21] Appl. No.: 388,400

[22] Filed: Jun. 14, 1982

[51] Int. Cl.[3] .............................................. H01L 41/08

[52] U.S. Cl. .................................... 310/316; 239/102; 123/494; 310/325

[58] Field of Search ................................ 310/316-318, 310/321, 323, 325; 318/116, 118; 123/478, 494; 239/102; 146/75; 73/204

[56] References Cited

U.S. PATENT DOCUMENTS

| | | | |
|---|---|---|---|
| 2,872,578 | 2/1959 | Kaplan et al. | 250/36 |
| 3,121,534 | 2/1964 | Wilson | 239/102 |
| 3,489,930 | 1/1970 | Shoh | 310/316 |
| 3,584,244 | 6/1971 | Vest | 310/316 |
| 3,694,713 | 9/1972 | Duren | 318/116 |
| 3,813,616 | 5/1974 | Antonevich | 310/316 X |
| 3,819,961 | 6/1974 | Bourgeois | 310/316 |
| 3,889,166 | 6/1975 | Scurlock | 310/316 X |
| 3,989,042 | 11/1976 | Mitsui | 310/316 X |
| 4,271,371 | 6/1981 | Furuichi et al. | 310/316 |
| 4,277,758 | 7/1981 | Mishiro | 310/316 X |

*Primary Examiner*—Mark O. Budd

*Attorney, Agent, or Firm*—J. G. Lewis; C. H. Grace

[57] ABSTRACT

An acoustic fuel injector-atomizer comprising a horn (74) actuated by piezoelectric crystals (28*a*, 28*b*) to form a resonant structure (18) excited by an oscillator signal. The oscillator (16) which generates the excitation signal is self-tuned to the resonant frequency of the structure (18) by means of a first transformer coupling (66, 56) which provides a feedback path between the structure (18) and the oscillator transistor (24) and a second transformer coupling (68, 56) which provides a compensation signal representing static capacitance of the crystals (28*a*, 28*b*). The compensation signal is subtracted from the feedback signal of the structure (18) so as to eliminate the static capacitance component as an error source in the self-tuning function.

15 Claims, 4 Drawing Figures

LOW POWER ACOUSTIC FUEL INJECTOR DRIVE CIRCUIT

TECHNICAL FIELD

This invention relates to fuel injection systems of the type using one or more acoustically-resonant structures and particularly to an oscillator circuit having multiple feedback paths for ensuring that the frequency of the actuation signal applied to the structure follows changes in the resonant frequency of the structure.

BACKGROUND OF THE INVENTION

Fuel injectors for internal combustion engines commonly used solenoid operated valves to meter fuel under pressure either upstream of a manifold type distribution system or on an individual cylinder basis at a point near the intake valve. The former arrangement is commonly called "throttle body injection" and the latter is commonly called "multipoint injection".

More recently it has been discovered that the fuel metering function and an atomizing function can be achieved using an acoustically resonant structure which is periodically excited with an alternating current excitation signal. Although such structure may take various forms, it may be generally described as comprising the combination of a mechanical device, such as a catenoidal hornshaped injector body, and an electrical device such as a piezoelectric crystal or an arrangement of several such crystals. One combination pertinent to the invention described herein comprises a catenoidal horn having a ball check valve in the fuel flow path near the small tip of the horn and a pair of electrically parallel-connected piezoelectric crystals mechanically abutting the large end of the horn. When the crystals are excited by an alternating current pulse of controlled frequency and amplitude, the horn is set into resonant vibration to unseat the ball and permit a metered quantity of fuel to flow to the combustion chamber or chambers.

The successful use of an acoustic fuel injector requires the ability to precisely control the injected fuel quantity under varying operating conditions. Such control is, in great measure, affected by the degree to which the frequency of the excitation signal matches the mechanically resonant frequency of the acoustic structure; i.e., even a small mis-match results in decreased vibration amplitude at the tip of the horn where metering and atomization takes place. This is a difficult match to maintain because, as previously described, the resonant structure includes both electrical and mechanical components. Moreover, the resonant frequency of the structure is not constant; rather, it is known to vary significantly with temperature, load and contamination level. Unless the frequency of the excitation signal can be made to follow such variations in mechanical resonant frequency, precise fuel metering is not possible.

It is known, therefore, that the oscillator and the resonant structure may be electrically integrated such that the resonant structure forms part of the tuning circuit of the oscillator. The result is a form of self-tuning wherein changes in the mechanically resonant frequency of the structure due to temperature, load and contamination are automatically reflected into the oscillator excitation frequency. The deficiency of such systems lies in the failure to compensate the self-tuning function for static components which do not follow or change in proportion to the changes in mechanical resonance.

BRIEF SUMMARY OF THE INVENTION

The present invention provides an acoustic injection system in which the oscillator and the resonant structure which meters and atomizes fuel are electrically integrated to provide a self-tuning function and, moreover, in which the static capacitive component of the excitation crystal or crystals is substantially eliminated such that the self-tuning function tracks only the resonant frequency changes which occur in the mechanical structure.

In brief, this is accomplished by providing a reactive circuit element such as a capacitor which substantially fits the static reactive component of the resonant structure to be eliminated, and connecting this reactive element into the oscillator tuning circuit in such a fashion as to cancel the effects of the static reactive component of the resonant structure from the self-tuning function in the oscillator.

According to a specific embodiment of the invention, hereinafter described in greater detail, the oscillator circuit comprises a transformer having two magnetic couplings, one coupling being provided between the resonant structure and the oscillator input to reflect the effects of mechanical resonance changes into the tuning of the oscillator, and the other coupling being provided between a reactive circuit element in circuit with the resonant structure and the oscillator input to compensate or cancel out of the self-tuning function the effects of static reactance in the resonant structure. A transformer winding in the oscillator input, therefore, serves to combine two feedback signals from the resonant structure such that the net result is a self-tuning function which more accurately follows changes in mechanical resonant frequency due to variable operating conditions.

DETAILED DESCRIPTION OF THE SPECIFIC EMBODIMENT

Figure 1:
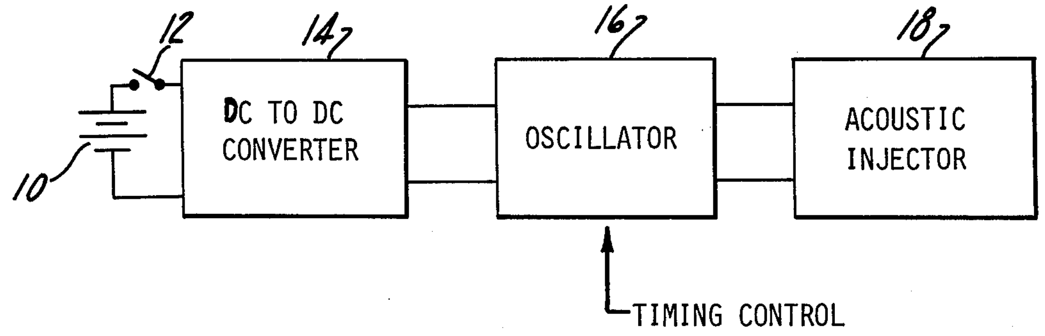
FIG. 1 is a block diagram of a fuel injection system of the acoustic-resonant type incorporating the present invention.

FIG. 1 illustrates an acoustic fuel injection system to comprise a conventional 12 volt storage battery 10 connected through a switch 12, such as a vehicle ignition switch, to a DC to DC converter 14 which converts the nominal 12 volt input to a regulated 200 volt DC supply voltage. Details of a preferred converter circuit may be found in the copending application "Fuel Injector Power Supply Including Regulated DC to DC Converter" filed in the name of the present inventor and assigned to Eaton Corporation (U.S. Ser. No. 388,350 filed June 14,1982).

The 200 volt regulated voltage from converter 14 is applied to an oscillator 16 which responds to externally generated timing and fuel demand signals to apply an alternating current excitation signal of controlled frequency and amplitude to an acoustic injector structure 18. Although the oscillator 16 and injector structure 18 are shown in FIG. 1 as physically separate elements of the system, it will be apparent from the following description that these elements are electrically integrated to the extent that the acoustic injector structure 18 forms part of the oscillator 16 for frequency-determination purposes.

It is further understood that the system of FIG. 1 is representative of both throttle body and multi-point injection systems and of systems having varying numbers of injector structures despite the following description of an illustrative arrangement having a single injector structure.

Figure 2:
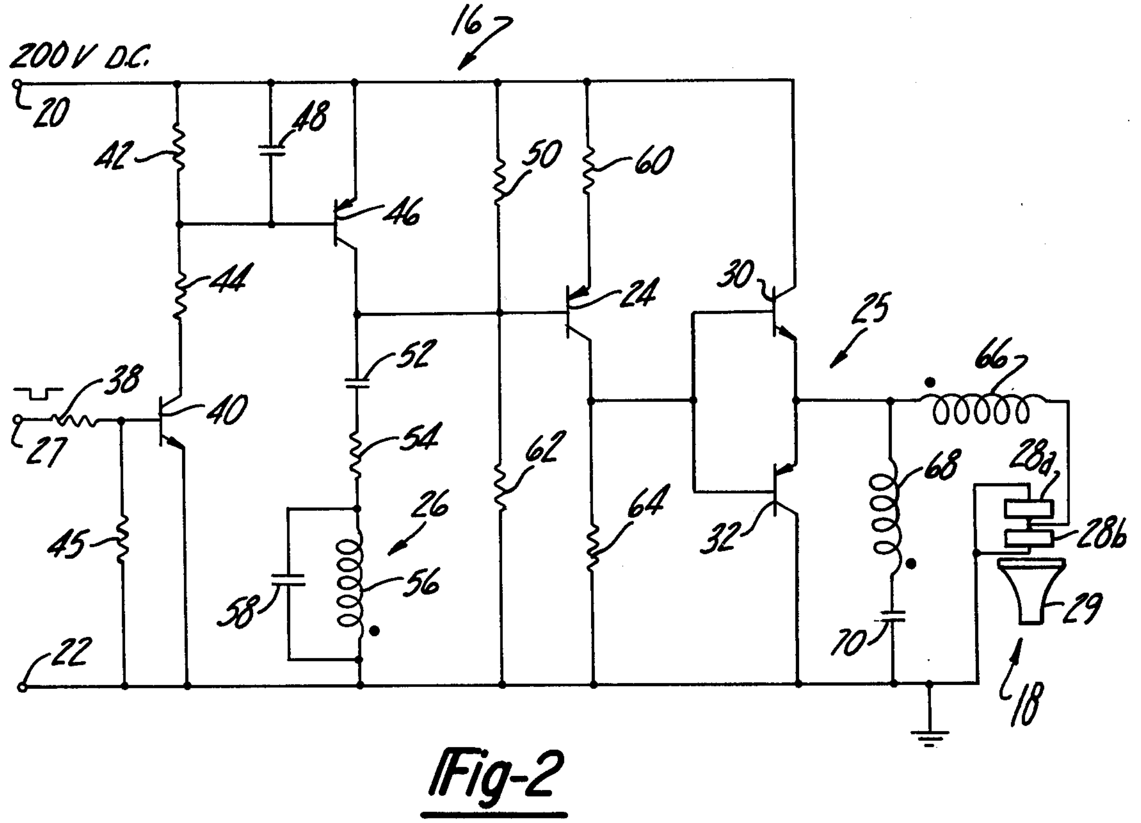
FIG. 2 is a schematic circuit diagram of a preferred oscillator utilizing piezoelectric actuator crystals.

Referring to FIG. 2, the details of a preferred combination of oscillator 16 and injector structure 18 will be described. The oscillator 16 comprises terminals 20 and 22 which are connected to receive the 200 volt regulated supply from converter 14 as previously described, an oscillator transistor 24, a driver stage 25 for applying the alternating current pulses from the oscillator transistor 24 to the acoustic injector structure 18, a tuning circuit generally designated 26, and a gate or trigger signal stage having input terminal 27 for receiving timing signals from an external source, not shown.

The injector structure 18 is diagrammatically shown in FIG. 2 to comprise a pair of matched piezoelectric crystals 28*a*, 28*b* electrically connected in parallel and mechanically mounted in series to mechanically excite a catenoidal injector horn 29 at a resonant frequency to meter atomized fuel to an engine, not shown.

The oscillator transistor 24 has its emitter connected to terminal 20 through a resistor 60 and its collector connected commonly to the base or input electrodes of complemental driver stage transistors 30 and 32 which are alternately rendered conductive as circuit oscillations occur. The collector of transistor 24 is also connected to ground terminal 22 through resistor 64. The emitters of driver transistors 30, 32 are connected through a first transformer winding 66 to the piezoelectric crystals 28*a*, 28*b* of resonant structure 18 to excite the crystals at the frequency of oscillation. This, in turn, excites the horn 29 to meter and atomize fuel in a manner to be described with reference to FIG. 4. In addition, the emitters of driver transistors are connected through a second transformer winding 68 to a capacitor 70 which is selected to substantially match the combined static capacitance of parallel-connected crystals 28*a*, 28*b*, thereby to also excite the capacitor 70 at the frequency of oscillation. The selection of capacitor 70 is made by applying an alternating current signal to crystals 28*a*, 28*b* which is well-removed from the normal frequency of oscillation of circuit 16 and measuring the reaction of crystals 28*a*, 28*b* with a standard capacitance meter.

Both of windings 66 and 68 are magnetically coupled with a secondary winding 56 in the tuning circuit 26 to effectively integrate the resonant structure 18 and the capacitor 70 with the oscillator and, more specifically, to provide two feedback signals to the tuning circuit by transformer action. The feedback signal from winding 66 represents the actual resonant frequency or frequencies of the structure 18 due to both mechanical and electrical properties of the structure 18; i.e., the feedback signal may include a first component determined by the mechanical properties of the entire structure 18 and which is variable with temperature, dirt accumulation and load, and a second component determined by the static capacitance of the crystals 28*a*, 28*b* and which is non-varying. The feedback signal from winding 68 on the other hand, represents only the response of capacitor 70 to the excitation signal. Windings 56, 66 and 68 are wound on a common core in the senses indicated by the dots in FIG. 2 and, therefore, the signal component from winding 68 subtracts from the signal from winding 66 in the secondary winding 56 and results in a feedback signal which is essentially free of the static capacitance component.

Describing the circuit of FIG. 2 in greater detail, the trigger circuit input terminal 27 is connected to the base of an npn transistor 40 through a resistor 38, the collector of which is connected to the 200 volt power supply terminal 20 through the combination of resistors 42, 44. The emitter of transistor 40 is connected to ground terminal 22 and the base of transistor 40 is connected to ground through a resistor 45. The junction point between resistors 42 and 44 is connected to the base electrode of a second gate circuit stage comprising pnp transistor 46, the emitter of which is connected to the high side of the supply. A capacitor 48 is connected between the supply and the base electrode of transistor 46. The collector of transistor 46 is connected to the base of oscillator transistor 24 and to one end of a resistor 50 so that as the transistor 46 is turned off and on, the resistor 50 is placed in and out of the base circuit of transistor 24. With resistor 50 in the circuit, transistor 24 is on and with resistor 50 shorted, transistor 24 is off; i.e., cannot oscillate.

The base circuit of transistor 24 further comprises capacitor 52 and resistor 54 connected in series with winding 56 and a capacitor 58 connected across the winding 56. A resistor 62 is connected between the base of transistor 24 and ground. The emitter of transistor 24 is connected to the high side of the supply through resistor 60 and the collector is connected to ground through resistor 64.

Figure 3:
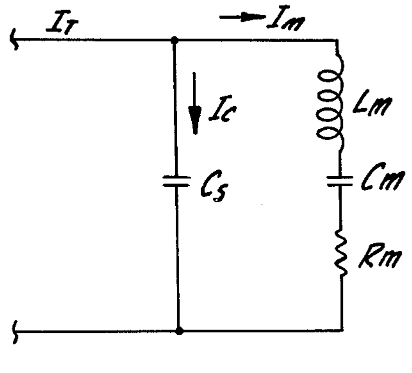
FIG. 3 is an equivalent circuit diagram of a mechanically resonant structure of the type used in the device of FIG. 2.

Before describing the operation of the circuit in detail, reference is taken to FIG. 3 where the equivalent circuit of the structure 18 is shown. This circuit comprises a first leg including the series combination of an inductive component $L_m$, a capacitive component $C_m$ and resistive component $R_m$ all of which are known to be temperature, load, and contaminant varying components. The equivalent circuit further comprises a large static capacitive component $C_s$ which is in parallel circuit relationship to the equivalent of the mechanical components and which is not substantially variable. The total current $I_t$ into the equivalent circuit and, hence, the total current into the structure 18 as shown in the circuit of FIG. 2, comprises the sum of the varying current $I_m$ and the non-varying reactive current component $I_c$.

Referring again to FIG. 2, the oscillator circuit is normally off and hence no alternating current is transferred through the driver stage 25 to the structure 18 from the 200 volt DC supply. Specifically, transistors 40, 46 are normally on so as to short circuit the resistor 50 and prevent oscillation of the circuit by biasing transistor 24 off. When the square wave trigger signal is received, transistors 40, 46 turn off. Resistor 50 is no longer short circuited and therefore biases transistor 24 on. The circuit now has sufficient loop gain and appropriate phase relationship to operate at the mechanically resonant frequency of structure 18 except for $I_c$ which will be cancelled out, as later described. The driver stage comprising transistors 30, 32 follows the oscillations of transistor 24 in complementary fashion to provide an alternating current signal to the injector structure 18 via winding 66 and to the compensating capacitor 70 via winding 68.

The feedback signal components of the overall structure 18 are reflected into the base or tuning circuit of transistor 24 via winding 56, but the feedback signal from winding 68 effectively cancels the component due to static capacitance in the crystals 28*a*, 28*b*. Accordingly, the oscillator is inherently resonant at the mechanically resonant frequency of the structure 18 over a wide range of actual operating conditions.

In an actual reduction to practice, the following circuit values have been found to produce satisfactory results and to achieve the object of the invention as previously stated.

| | |
|---|---|
| Resistor 38 | 1K |
| Resistor 42 | 10K |
| Resistor 44 | 75K |
| Resistor 45 | 10K |
| Capacitor 48 | 470pf |
| Capacitor 52 | .1uf |
| Resistor 54 | 220 Ohms |
| Winding 56 | 20T, No. 27 |
| Capacitor 58 | .22uf |
| Resistor 50 | 5K |
| Resistor 62 | 100K |
| Resistor 60 | 220 Ohms |
| Resistor 64 | 24K |
| Capacitor 70 | 550pf |
| Winding 66 | 10T, No. 27 |
| Winding 68 | 10T, No. 27 |
| Transformer Core | 266 CP 1253B7 Ferroxcube |

Figure 4:
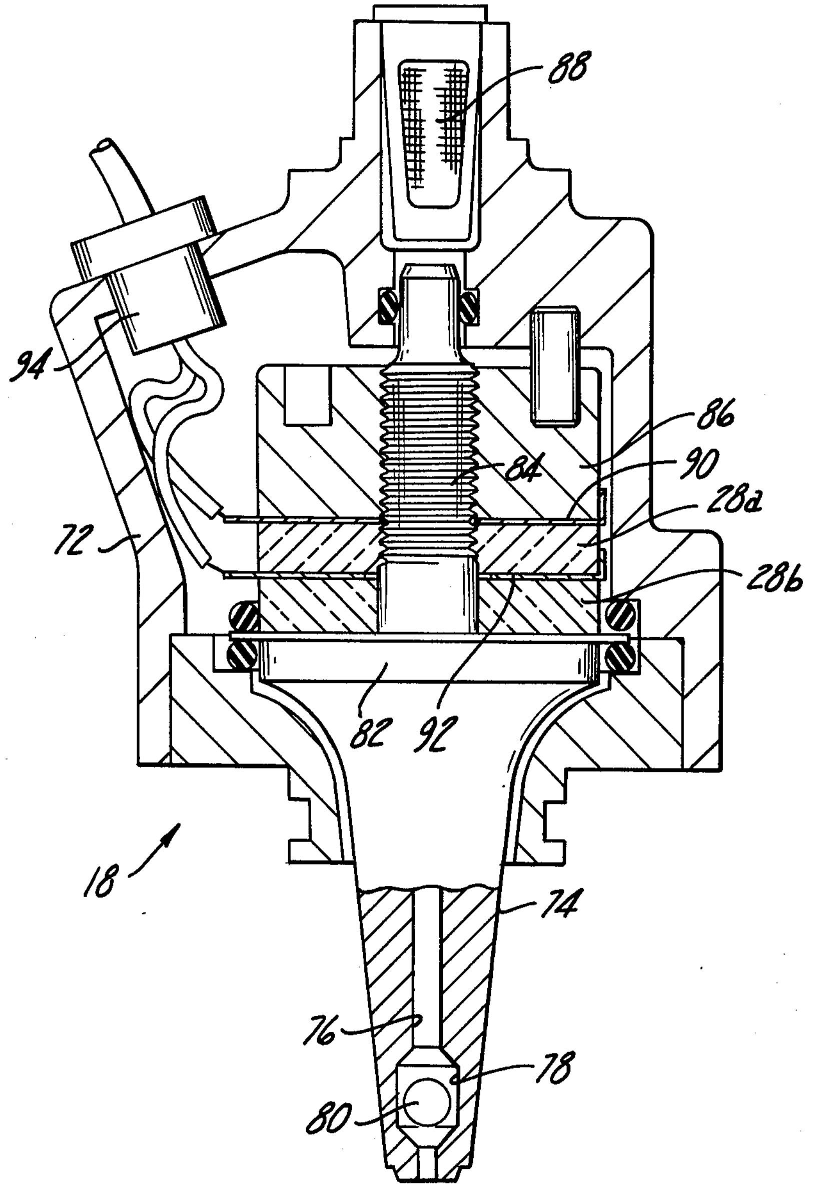
FIG. 4 is a sectional view of an injector device useful in the circuit of FIG. 2.

Referring now to FIG. 4, the details of a preferred injector structure 18 are shown to comprise a housing 72 carrying a catenoidal horn injector 74 of stainless steel having a through bore 76. The bore 76 exhibits an area 78 of increased diameter near the injector tip to accommodate and provide seats for a ball 80 which operates as a check valve for fuel flow control purposes. The horn 74 is mechanically grounded in the housing 72 by means of a flange 82. A threaded post 84 extends into a back mass 86 which is loosely pinned into housing 72 as shown. The post 84 is hollow and communicates the bore 76 to a fuel supply through a filter 88.

Crystals 28*a*, 28*b* are sandwiched between the back mass 86 and the flange 82 along with spacer contacts 90 and 92 for electrical connection purposes; i.e., spacer contact 92 is between and abuts one face of each crystal 28*a*, 28*b* but is spaced radially from post 84 to apply the excitation signal to the crystals. Spacer contact 90 provides the ground contact directly to crystal 28*a* and via post 84 and flange 82 to crystal 28*b*. Both spacer-contacts 90 and 92 have center holes and bent up tabs at the outer radii thereof to center themselves relative to the post 84; this is especially advantageous in the case of contact 92 which must not contact the post 84. A connector 94 brings the lead wires in from the external circuit.

It is to be understood that various modifications and additions to the illustrative embodiment described herein may be made without departing from the spirit and scope of the invention.

I claim:

1. An acoustic fuel injector system comprising:

a mechanically resonant injector structure responsive to an alternating current excitation signal to meter and atomize fuel supplied thereto;

oscillator circuit means for producing an alternating current excitation signal;

a reactive circuit element corresponding in value to a substantially static electrical property of the injector structure;

means for applying the excitation signal to the injector structure and to the reactive circuit element;

first feedback means electrically connecting the structure to the oscillator for tuning the frequency of the excitation signal to the resonant response frequency of the structure;

and second feedback means electrically connecting the reactive circuit element to the oscillator for cancelling the effect of the static electrical property of the structure from the excitation signal frequency.

2. Apparatus as defined in claim 1 wherein the structure comprises at least one piezoelectric crystal and an acoustic injector horn mechanically connected to the crystal to be mechanically excited thereby.

3. Apparatus as defined in claim 2 wherein the horn includes check valve.

4. Apparatus as defined in claim 1 wherein the structure comprises a pair of piezoelectric crystals and an acoustic injector horn mechanically connected to the crystals to be mechanically excited thereby.

5. Apparatus as defined in claim 4 wherein the horn includes a check valve.

6. Apparatus as defined in claim 1 wherein the oscillator circuit means includes a driver stage.

7. Apparatus as defined in claim 1 wherein the oscillator circuit means includes a tuning circuit having a first transformer winding, said first feedback means comprises a second transformer winding in circuit with the structure and magnetically coupled to the first winding; said second feedback means comprising a third transformer winding in circuit with the reactive circuit element and magnetically linked to the first winding; the sense of the first, second and third windings being such as to subtract the electrical signal coupled into the first winding by the third winding from the electrical signal coupled into the first winding by the second winding.

8. Apparatus as defined in claim 1 including gate circuit means connected to the oscillator circuit means for controlling the operable and inoperable times thereof.

9. Apparatus as defined in claim 1 wherein the resonant structure comprises a catenoidal horn having a check valve.

10. Apparatus as defined in claim 1 wherein the reactive circuit element is a capacitor.

11. For use with fuel injection apparatus of the type including an injector horn having a check valve, and at least one piezoelectric crystal mechanically connected to the horn to operate the check valve when excited with an alternating current excitation signal, the combination of the horn and crystal having a mechanically resonant frequency which varies according to operating conditions, the crystal having an ascertainable electrical reactance which is substantially non-varying with operating conditions, the improvement which comprises:

oscillator means for producing an excitation signal;

a reactive circuit element corresponding in value to the reactance of the crystal;

means for simultaneously applying the excitation signal to both the crystal and the reactive circuit element;

and feedback means for applying a feedback signal to the oscillator means corresponding to the difference between the excitation frequency responses of the crystal and the reactive circuit element.

12. Apparatus as defined in claim 11 wherein the feedback means comprises a first transformer winding in circuit with the oscillator means, a second transformer winding in circuit with the crystal and a third transformer winding in circuit with the reactive circuit element, the second and third windings being coupled with the first winding in opposite sense.

13. Apparatus as defined in claim 12 wherein the second winding and the crystal are connected in a first series circuit, the third winding and the reactive element are connected in a second series circuit, the first and second series circuits being connected in parallel to one another.

14. Apparatus as defined in claim 13 wherein the oscillator means comprises a transistor, and a driver stage connecting the transistor to the first and second series circuits.

15. Apparatus as defined in claim 13 further including gate circuit means connected to turn the oscillator means on and off according to a timing signal applied to the gate circuit means.

* * * * *